(12) United States Patent
Sudo et al.

(10) Patent No.: US 8,936,684 B2
(45) Date of Patent: Jan. 20, 2015

(54) VITREOUS SILICA CRUCIBLE

(75) Inventors: Toshiaki Sudo, Akita (JP); Hiroshi Kishi, Akita (JP); Ken Kitahara, Akita (JP)

(73) Assignee: Japan Super Quartz Corporation, Akita-shi (JP)

(*) Notice: Subject to any disclaimer, the term of this patent is extended or adjusted under 35 U.S.C. 154(b) by 590 days.

(21) Appl. No.: 13/308,344

(22) Filed: Nov. 30, 2011

(65) Prior Publication Data
US 2012/0137964 A1 Jun. 7, 2012

(30) Foreign Application Priority Data
Dec. 3, 2010 (JP) ................. 2010-270925

(51) Int. Cl.
*C30B 15/10* (2006.01)
*C03B 19/09* (2006.01)

(52) U.S. Cl.
CPC ............... *C30B 15/10* (2013.01); *C03B 19/095* (2013.01)
USPC ............... 117/208; 117/11; 117/13; 117/200; 117/206

(58) Field of Classification Search
CPC ........ C30B 15/00; C30B 15/10; C30B 29/06; C03B 20/00; C03B 19/09; C03B 19/095
USPC ................ 117/11, 13, 200, 206, 208, 928, 117/931–932
See application file for complete search history.

(56) References Cited

U.S. PATENT DOCUMENTS 5,174,801 A 12/1992 Matsumura
5,885,071 A * 3/1999 Watanabe et al. ............ 432/264

2003/0041623 A1 3/2003 Werdecker
2008/0196448 A1 8/2008 Borens

FOREIGN PATENT DOCUMENTS

| EP | 0 463 543 A1 * | 1/1992 |
|---|---|---|
| EP | 0463543 A1 | 1/1992 |
| JP | 2000-247778 A | 9/2000 |
| JP | 2006-169084 A | 6/2006 |
| JP | 2008-214189 A | 9/2008 |

OTHER PUBLICATIONS

Extended European Search Report mailed Mar. 26, 2012, issued in corresponding Application No. EP 11191170.7, 6 pages.

* cited by examiner

*Primary Examiner* — Kenneth A Bratland, Jr.
(74) *Attorney, Agent, or Firm* — Christensen O'Connor Johnson Kindness

(57) ABSTRACT

The present invention provides a vitreous silica crucible which can suppress buckling and sidewall lowering of the crucible and the generation of cracks. According to the present invention, a vitreous silica crucible is provided for pulling a silicon single crystal having a wall, the wall including a non-doped inner surface layer made of natural vitreous silica or synthetic vitreous silica, a mineralizing element-maldistributed vitreous silica layer containing dispersed island regions each containing a mineralizing element, and wherein the vitreous silica of the island regions and the vitreous silica of a surrounding region of the island regions is a combination of mineralizing element-doped natural vitreous silica and non-doped synthetic vitreous silica, or a combination of mineralizing element-doped synthetic vitreous silica and non-doped natural vitreous silica, and the inner surface layer is made of vitreous silica of a different kind from that of the island region.

11 Claims, 2 Drawing Sheets

Enlarged View of Region A

VITREOUS SILICA CRUCIBLE

CROSS-REFERENCE TO RELATED APPLICATION

This application is related to Japanese Patent Application No. 2010-270925 filed on Dec. 3, 2010, whose priority is claimed and the disclosure of which is incorporated by reference in its entirety.

BACKGROUND OF THE INVENTION

1. Field of the Invention

The present invention relates to a vitreous silica crucible.

2. Description of the Related Art

In general, silicon single crystal is manufactured by melting high-purity polycrystalline silicon in a vitreous silica crucible to obtain a silicon melt, dipping an end of a seed crystal to the silicon melt, and pulling the seed crystal while rotating it.

The melting point of silicon is 1410 degrees C., and thus the temperature of the silicon melt is kept at a temperature equal to or higher than 1410 degrees C. At such temperature, a vitreous silica crucible reacts with the silicon melt, and the thickness of the crucible wall gradually decreases. When the thickness of the crucible wall decreases, the strength of the crucible is lowered. This leads to problems such as buckling and sidewall lowering of the crucible.

In order to solve such problems, there is known a technique to provide a layer, on the outside of the crucible, to promote crystallization. When such a layer is provided, the outer layer of the crucible is crystallized and the crucible strength is improved (e.g., JP-A-2000-247778). When such a layer is provided, the outer layer of the crucible is crystallized when the crucible is heated for a long time. Crystalline silica has higher strength per unit thickness than vitreous silica. Therefore, the crystallization enhances the strength per unit thickness, and suppresses buckling or sidewall lowering of the crucible.

SUMMARY OF THE INVENTION

Conventionally, a vitreous silica crucible is used to pull a single silicon ingot, and after the single pulling, the vitreous silica crucible is discarded without being reused (such pulling is called "single pulling"). However, nowadays, for the purpose of cost reduction of a silicon ingot, a vitreous silica crucible is used for multi-pulling, where after a first silicon ingot is pulled using a vitreous silica crucible, the vitreous silica crucible is re-used for pulling a second silicon ingot by re-charging and melting polycrystalline silicon before the crucible is cooled down. Thus, "multi-pulling" means pulling multiple silicon ingots using a single vitreous silica crucible.

According to the technique of JP-A-2000-247778, an Al-added silica layer is formed as the outer layer, for example, in a thickness of 4 mm, and when a crucible has such a thickness, the buckling and sidewall lowering of the crucible can be effectively suppressed in single pulling. However, in multi-pulling, the crucible is exposed to a high temperature environment for a longer time, and thus the reduction of the wall thickness and softening of the crucible is more eminent, and thus the buckling and sidewall lowering of the crucible cannot be sufficiently suppressed according to the technique of JP-A-2000-247778, and thus the crucible strength needs to be enhanced.

When the Al-added silica layer of the outer layer is thickened in the technique of JP-A-2000-247778, a crystallized layer formed in the outer layer is also thickened, and thus the crucible strength is expected to increase. However, when the crystallized layer is thickened, cracks are more likely to be formed in the crucible. When the cracks are formed in the crucible, the high temperature silicon melt inside the crucible leaks from the crucible, and all surrounding devices are damaged. Therefore, it is difficult to improve the crucible strength by thickening the crystallized layer in the outer layer.

The present invention has been made in view of these circumstances, and provides a vitreous silica crucible which can suppress buckling and sidewall lowering of the crucible and generation of cracks.

According to the present invention, provided is a vitreous silica crucible for pulling a silicon single crystal having a wall, the wall comprising, from an inner surface side toward an outer surface side of the crucible, a non-doped inner surface layer made of natural vitreous silica or synthetic vitreous silica, a mineralizing element-maldistributed vitreous silica layer containing dispersed island regions each containing a mineralizing element (hereinafter referred to as "mineralizing element-maldistributed layer"), and wherein the vitreous silica of the island regions and the vitreous silica of a surrounding region of the island regions is a combination of mineralizing element-doped natural vitreous silica and non-doped synthetic vitreous silica, or a combination of mineralizing element-doped synthetic vitreous silica and non-doped natural vitreous silica, and the inner surface layer is made of vitreous silica of a different kind from that of the island region.

The crucible of the present invention includes, on the outer side of the non-doped inner surface layer, a mineralizing element-maldistributed layer containing dispersed island regions each containing a mineralizing element.

The mineralizing element has a function to promote crystallization of a vitreous silica layer of a crucible when the crucible is heated during pulling of a silicon ingot. When the mineralizing element uniformly exists in the vitreous silica layer, the entire vitreous silica layer is crystallized. Crystalline silica is more difficult to be deformed than vitreous silica, and thus when the entire vitreous silica layer is crystallized, cracks are easier to be formed in the crucible.

In the present invention, the mineralizing element-maldistributed layer contains dispersed island regions each containing a mineralizing element, and thus this layer contains a portion whose mineralizing element concentration is high and a portion substantially not containing a mineralizing element. In the portion substantially not containing a mineralizing element, crystallization of vitreous silica is very slow, and thus crystallization started in the portion whose mineralizing element concentration is high is difficult to spread to the portion substantially not containing a mineralizing element. As a result, island-like crystals are formed in the vitreous silica layer. In such configuration, when stress is applied to the vitreous silica layer, vitreous silica portions existing between the adjacent island-like crystals are deformed to suppress generation of cracks in the crucible.

The vitreous silica of the island regions and the vitreous silica of the surrounding region is a combination of mineralizing element-doped natural vitreous silica and non-doped synthetic vitreous silica. When both of the vitreous silica of the island regions and the vitreous silica of the surrounding region are natural vitreous silica or both are synthetic vitreous silica, the crystallization started at the island regions spreads to the surrounding region, and eventually the mineralizing element-maldistributed layer is entirely crystallized. However, when the vitreous silica of the island regions is different from that of the surrounding region (i.e., when one is synthetic vitreous silica, and the other is natural vitreous silica), the crystallization started at the island regions hardly spread to the surrounding region.

Furthermore, the non-doped inner surface layer does not substantially contain a mineralizing element, and is made of vitreous silica of a different kind from the vitreous silica of the island region. Therefore, the crystallization started at the mineralizing element-maldistributed layer does not spread to the inner surface layer, and thus silicon melt is not contaminated.

In sum, according to the present invention, there is provided a vitreous silica crucible which can suppress buckling and sidewall lowering of the crucible and generation of cracks.

DESCRIPTION OF THE PREFERRED EMBODIMENTS

1. Configuration of Vitreous Silica Crucible

Figure 1:
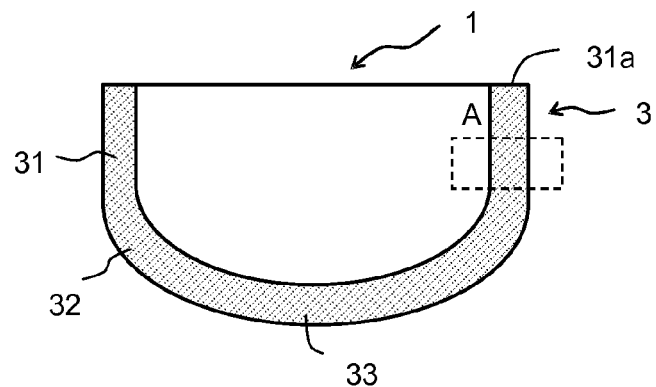
FIG. 1 is a sectional view showing a structure of vitreous silica crucible of one embodiment of the present invention.
Figure 2:
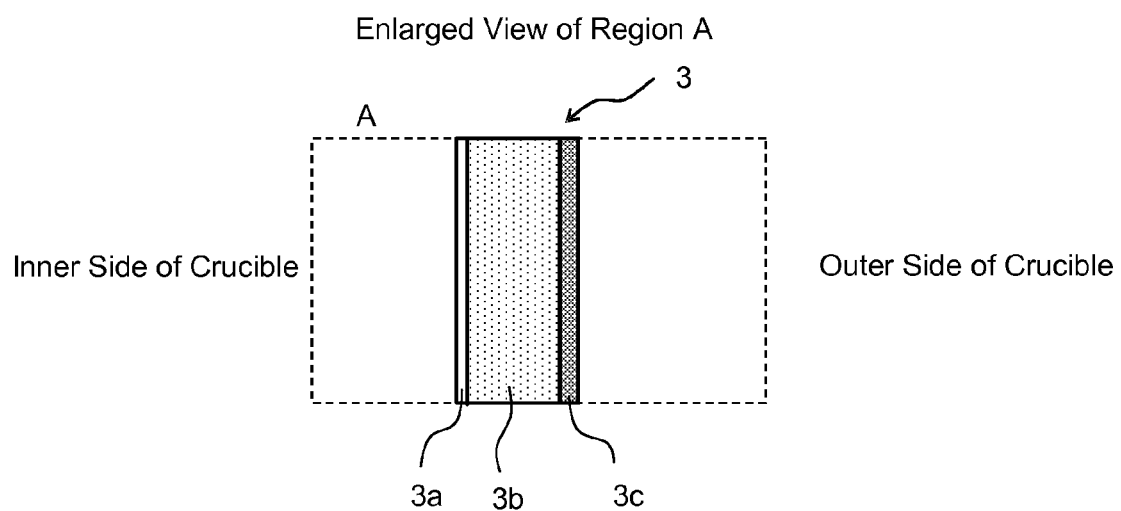
FIG. 2 is an enlarged view of region A in FIG. 1.

Hereinafter, with reference to FIGS. 1 and 2, embodiments of a vitreous silica crucible of the present invention will be explained. FIG. 1 is a sectional view showing a structure of a vitreous silica crucible of the present embodiment, and FIG. 2 is an enlarged view of the region A in the FIG. 1.

The vitreous silica crucible 1 of the present embodiment is a vitreous silica crucible 1 for pulling a silicon single crystal, and the wall 3 of the crucible 1 includes, from an inner surface side toward an outer surface side of the crucible 1, a non-doped inner surface layer 3a made of natural vitreous silica or synthetic vitreous silica, a mineralizing element-maldistributed layer 3b containing dispersed island regions each containing a mineralizing element, and a mineralizing element uniformly-distributed vitreous silica layer 3c containing a substantially uniformly dispersed mineralizing element (hereinafter referred to as "mineralizing element uniformly-distributed layer"). The vitreous silica of the island regions and the vitreous silica of the surrounding region is a combination of mineralizing element-doped natural vitreous silica and non-doped synthetic vitreous silica, or a combination of mineralizing element-doped synthetic vitreous silica and non-doped natural vitreous silica, and the inner surface layer is made of vitreous silica of a different kind from the vitreous silica of the island region.

Here, the respective components are explained in detail.
(1) Vitreous Silica Crucible 1

The vitreous silica crucible 1 of the present embodiment is used for pulling a silicon single crystal, and can be used for either single pulling and multi-pulling, but it is preferred to be used for multi-pulling. This is because the vitreous silica crucible 1 of the present embodiment solves problems which, as mentioned above, are eminent in multi-pulling, more effectively than an conventional crucible.
(2) Wall 3 of Vitreous Silica Crucible As shown in the sectional view of FIG. 1, the wall 3 of vitreous silica crucible 1 has a corner portion 32, a cylindrical sidewall portion 31, and a bottom portion 33. The corner portion 32 has a relatively large curvature. The sidewall portion 31 has a rim portion having an upward opening. The bottom portion 33 is flat or has a relatively small curvature, and is mortar-shaped. The wall 3 includes, from an inner surface side toward an outer surface side of the crucible, a synthetic layer 3a, a mineralizing element-maldistributed layer 3b, and a mineralizing element uniformly-distributed layer 3c. In the present invention, the corner portion refers to a portion connecting the sidewall portion 31 and the bottom portion 33, and starts at a point where a line tangential to the corner portion 32 overlaps with the sidewall portion 31 and ends at a point where the corner portion 32 and the bottom portion 33 have a common tangential line. In other words, the boundary between the sidewall portion 31 and the corner portion 32 is a point where a straight portion of the wall 3 starts to curve. Furthermore, the portion with a constant curvature at the bottom of the crucible is the bottom portion 33, and as the distance from the center of the crucible increases, a point where the curvature starts to change is the boundary between the bottom portion 33 and the corner portion 32.
(2-1) Inner Surface Layer 3a The non-doped inner surface layer 3a is an innermost layer of the crucible 1, and contacts silicon melt. In the present specification, "Non-doped" used herein means that the impurity concentration is 20 ppm or less (preferably 15 ppm or less). The inner surface layer 3a is made of natural vitreous silica or synthetic vitreous silica. Natural vitreous silica is vitreous silica obtained by fusing and solidifying silica powder obtained from a natural mineral whose main component is α-quartz. Synthetic vitreous silica is vitreous silica obtained by fusing and solidifying chemically synthesized amorphous or crystalline silica (silicon oxide) powder, and has very low impurity concentration. Therefore, it is possible to reduce the amount of impurities mixed in silicon melt by providing the inner surface layer 3a made of synthetic vitreous silica. The method of chemical synthesis of silica is not in particular limited, and, may be, for example, gas phase oxidation (dry synthesis) of silicon tetrachloride ($SiCl_4$), or hydrolysis (sol-gel method) of silicon alkoxide ($Si(OR)_4$). The inner surface layer 3a gradually corrodes through the reaction with silicon melt during pulling of a silicon ingot. Therefore, the inner surface layer 3a needs to have a thickness sufficient to remain until the end of the pulling of a silicon ingot, and the thickness is preferred to be, for example, approximately 0.8 to 2 mm.
(2-2) Mineralizing Element-Maldistributed Layer 3b The mineralizing element-maldistributed layer 3b is a layer disposed on the outer side of the inner surface layer 3a, and is a vitreous silica layer containing dispersed island regions each containing a mineralizing element. The mineralizing element has a function to promote crystallization of vitreous silica, and thus vitreous silica is crystallized during pulling of a silicon ingot at the island regions containing a mineralizing element.

The vitreous silica of the island regions and the vitreous silica of the surrounding region is a combination of mineralizing element-doped natural vitreous silica and non-doped synthetic vitreous silica, or a combination of mineralizing element-doped synthetic vitreous silica and non-doped natural vitreous silica. When both of the vitreous silica of the island regions and the vitreous silica of the surrounding region are natural vitreous silica or both are synthetic vitreous silica, the crystallization started at the island regions spreads to the surrounding region, and eventually the mineralizing element-maldistributed layer is entirely crystallized. However, when the vitreous silica of the island regions is different from that of the surrounding region (i.e., when one is synthetic vitreous silica, and the other is natural vitreous silica), the crystallization started at the island regions hardly spread to the surrounding region.

Furthermore, when the vitreous silica of the inner surface layer 3a is the same kind as that of the island region, there occurs a problem that the crystallization started at the island regions spreads to the inner surface layer 3a, and thus the vitreous silica of the inner surface layer 3a needs to be of a different kind from that of the island region. Therefore, when the inner surface layer 3a is made of synthetic vitreous silica, the vitreous silica of the island regions and the vitreous silica of the surrounding region needs to be a combination of mineralizing element-doped natural vitreous silica and non-doped synthetic vitreous silica, and when the inner surface layer 3a is made of natural vitreous silica, the vitreous silica of the island regions and the vitreous silica of the surrounding region needs to be a combination of mineralizing element-doped synthetic vitreous silica and non-doped natural vitreous silica.

When the size of the island regions is not in particular limited, but when the island regions is too small, the improvement of the crucible strength becomes insufficient, and when the island regions is too large, cracks are easier to be formed in the crucible. Thus, the average diameter of the island regions is preferred to be 50 μm to 1 mm, and more preferred to be 100 to 800 μm, and even more preferred to be 200 to 500 μm. In general, the average diameter of silica powder to form a vitreous silica layer is approximately 200 to 400 μm, and the spread of the mineralizing element during fusing the silica powder is slight. Therefore, it is easy to form island regions having an average diameter of 200 to 500 μm by fusing mixed silica powder obtained by mixing mineralizing element-doped silica powder and non-doped silica powder to form the mineralizing element-maldistributed layer. Furthermore, by use of silica powder obtained by doping, with a mineralizing element, smaller or larger silica powder, it is possible to form island regions having an average diameter of 50 μm to 1 mm. The island regions may be formed by other methods.

"Particle size" is, in general, as shown in the section of the term definition of "Test Powder and Test Particles" in JIS Z 8901, a size represented by the aperture size of a test sieve used for the measurement in the screening method, a size represented by the Stokes equivalent diameter obtained by the sedimentation method, a size represented by a circle equivalent diameter obtained in the microscope method, a size represented by a sphere equivalent diameter obtained by the light scattering method, or a size represented by a sphere equivalent diameter obtained by the electrical resistance test, and is also referred to as "particle diameter." However, in the present specification, the particle size distribution is measured by use of the laser diffraction/scattering measurement method using laser light as a light source.

The principle is to utilize a phenomenon that when particles are irradiated with light, the intensity and pattern of the light scattered by each particle changes depending on the particle diameter (Mie scattering). When the particle diameter is large, the intensity of the scattered light in all direction is strong, and the intensity of the forward scattered light is in particular strong. As the particle diameter decreases, the overall scattered light intensity weakens, and the forward-scattered light is only weakly detected. Therefore, when the particle diameter is large, the forward-scattered light collected by a convex lens generates a diffraction pattern on the focal plane. The brightness and size of the diffracted light depends on the particle size (particle diameter). Therefore, by use of information from the scattered light, the particle diameter can be obtained easily.

In contrast, when the particle diameter decreases, the intensity of the forward-scattered light weakens, and thus it is difficult to detect the light by use of a detector mounted in front. However, as the scattering pattern of the side-way and back scattered light changes depending on the particle diameter, it is possible to determine the particle diameter by measuring these. The measurement result is compared with a spherical particle exhibiting a scattering pattern equivalent to the scattering pattern for the measured particle, and the result is outputted as a particle size distribution. Therefore, for example, when a measured particle exhibits a diffracted/scattered light pattern equivalent to a sphere having a diameter of 1 μm, the diameter of the particle is determined to be 1 μm irrespective of the shape. The diameter is different from that determined by other measurement methods using visual or image analysis, such as "Feret diameter" corresponding to the length in a specific axis direction of randomly oriented particles, "equivalent diameter" corresponding to the size of a particle of an ideal shape (usually a circle) which has the same area as the projected area of the particle, or an aspect ratio representing the ratio of the long axis and short axis. Furthermore, the "average particle diameter" represents a particle diameter at an integrated value of 50% in the obtained particle size distribution.

The outer edge of the island region can be specified by determining the concentration maximum value of the mineralizing element in the island region, connecting points having one tenth (1/10) of the maximum value, and measuring the diameter of the circumscribed circle surrounding the connected points. The diameter of the circumscribed circle is the diameter of the island region. The average diameter of the island regions is an average value of the diameters of the neighboring ten island regions. The concentration at a micro region can be measured by using Secondary Ion Mass Spectrometry (SIMS) which can determine distribution and quantity of respective elements by irradiating a sample with ions, and analyzing, by mass spectrometry, secondary ions released from the surface of the sample by sputtering.

Specifically, a sample having a square of 10 mm×10 mm and a thickness of 3 mm is cut out from the crucible, and the sample is set on a sample holder in a way that a surface, of the sample, vertical to the inner surface of the crucible is irradiated with primary ions. Then, the sample is irradiated with the primary ions of oxygen ($O^{2+}$) or cesium ($Cs^+$) under vacuum atmosphere. Then, secondary ions released by the irradiation of the primary ions are analyzed by mass spectrometry to identify elements constituting the sample. Then, the concentrations of the respective elements of the sample can be quantitatively analyzed by the ratio of the strength of the secondary ions of the sample and the strength of the secondary ions released from a standard sample (concentrations of constituent elements of the standard sample are known).

The concentration maximum value of a mineralizing element in the island regions is preferred to be 20 to 600 ppm. When the concentration is too low, the crystallization becomes too slow, and when the concentration is too high, the crystallization can spread to the surrounding region.

The mineralizing element used herein refers to an element which promotes crystallization of vitreous silica. It can exist in vitreous silica in the form of an inorganic salt, nitrate, carbonate, sulfate, acetate, oxalate, fluoride salt, phosphate, oxide, peroxide, hydroxide, chloride, or may be substituted for Si of vitreous silica, or in the ionized state, or in the state of a compound such as $Al_2O_3 \cdot 2SiO_2$. The kind of the mineralizing element is not in particular limited as long as the mineralizing element promotes crystallization of the vitreous silica. The kind of the mineralizing element is preferably metal impurities, because metal impurities particularly promote crystallization. The kind of the mineralizing element is, for example, alkali metal (e.g., sodium or potassium), alkali earth metal (magnesium, calcium, strontium, or barium), aluminium, or iron. When aluminium is added, the viscosity of vitreous silica is enhanced, and thus the mineralizing element is preferred to be aluminium.

The mineralizing element-maldistributed layer 3b may be in contact with the inner surface layer 3a, or there may be provided another layer (e.g., natural vitreous silica layer (hereinafter referred to as "natural layer") between the mineralizing element-maldistributed layer 3b and the inner surface layer 3a. The natural layer is a layer formed of vitreous silica obtained by fusing and solidifying silica powder obtained from natural mineral whose main component is α-quartz. When α-quartz is fused, the viscosity is largely reduced. However, the chain structure of the repetition of SiO bond is not completely destroyed, and thus natural vitreous silica still contains crystalline microstructure therein, and thus natural vitreous silica is not easily deformed. Thus, the natural layer has relatively high viscosity.

The mineralizing element-maldistributed layer 3b in the sidewall portion 31 needs to have a thickness enough to maintain the crucible strength, and the thickness is, for example, approximately 4 to 15 mm. When the mineralizing element-maldistributed layer 3b is too thin, the improvement of the crucible strength is insufficient, and when it is too thick, the total wall thickness becomes too large.

(2-3) Mineralizing Element Uniformly-Distributed Layer 3c

The mineralizing element uniformly-distributed layer 3c is a layer optionally provided on the outer side of the mineralizing element-maldistributed layer 3b, and contains a substantially uniformly dispersed mineralizing element. The mineralizing element uniformly-distributed layer 3c can be omitted. The mineralizing element uniformly-distributed layer 3c is crystallized at an early stage of the pulling of a silicon ingot, and enhances the crucible strength. "Substantially uniformly" means that a mineralizing element is uniformly dispersed to an extent that the mineralizing element crystallizes the mineralizing element uniformly-distributed layer in its entirety. Therefore, in the mineralizing element uniformly-distributed layer 3c, although the mineralizing element is preferred to be uniformly dispersed, but it does not have to be completely uniformly dispersed, and there may be some nonuniformity in the concentration.

The concentration of the mineralizing element in the mineralizing element-maldistributed layer 3c is not in particular limited, but is preferred to be 20 to 600 ppm. When the concentration is too low, the crystallization becomes too slow, and when the concentration is too high, the crystallization becomes too fast, which may become a cause of formation of cracks or the mineralizing element may be dispersed to reach silicon melt. Furthermore, the mineralizing element uniformly-distributed layer 3c is preferred to be crystallized at an earlier stage than the mineralizing element-maldistributed layer 3b, and thus it is preferred that the mineralizing element uniformly-distributed layer 3c contains a mineralizing element in a higher concentration than the concentration maximum value of the mineralizing element in the island region. The mineralizing elements that can be included in the mineralizing element-maldistributed layer 3c are the same as those of the mineralizing element-maldistributed layer 3b. The mineralizing element in the mineralizing element uniformly-distributed layer 3c can be the same as or different from that of mineralizing element-maldistributed layer 3b.

The vitreous silica of the mineralizing element uniformly-distributed layer 3c is of a different kind from that of the surrounding region of the island regions (one is natural vitreous silica, and the other is synthetic vitreous silica). When these vitreous silicas are the same, the crystallization started at the mineralizing element uniformly-distributed layer 3c spreads to the entire mineralizing element-maldistributed layer 3b, and thus the mineralizing element-maldistributed layer 3b is entirely crystallized, which leads to formation of cracks. Therefore, when the vitreous silica of the surrounding region of the island regions is synthetic vitreous silica, the vitreous silica of the mineralizing element uniformly-distributed layer 3c needs to be natural vitreous silica, and in contrast, when the vitreous silica of the surrounding region of the island regions is natural vitreous silica, the vitreous silica of the mineralizing element uniformly-distributed layer 3c needs to be synthetic vitreous silica. The mineralizing element uniformly-distributed layer 3c is preferred to be natural vitreous silica in view of enhancing the high-temperature strength of the crucible.

The thickness of the mineralizing element uniformly-distributed layer 3c in the sidewall portion 31 is, for example, 1 to 4 mm. When the mineralizing element uniformly-distributed layer 3c is too thin, the improvement of the crucible strength is insufficient, and when it is too thick, cracks become more likely to be formed in the crucible.

2. Method of Manufacturing Vitreous Silica Crucible

The vitreous silica crucible 1 of the present embodiment can be manufactured by the processes of (1) forming a silica powder layer for a mineralizing element uniformly-distributed layer 3c, a mineralizing element-maldistributed layer 3b, and an inner surface layer 3a, by depositing crystalline or amorphous silica powder on the inner surface (the bottom surface and the side surface) of a rotating mold, and (2) vitrifying the silica powder layer by heating and fusing the silica power layer up to a temperature of 2000 to 2600 degrees C. by use of arc discharge, followed by cooling.

The silica powder to form the natural vitreous silica (natural silica powder) can be manufactured by pulverizing natural mineral whose main component is α-quartz.

The silica powder to form the synthetic vitreous silica (synthetic silica powder) can be manufactured by chemical synthesis, such as gas phase oxidation (dry synthesis) of silicon tetrachloride ($SiCl_4$), or hydrolysis (sol-gel method) of silicon alkoxide ($Si(OR)_4$).

The mineralizing element-maldistributed layer 3b can be formed by fusing mixed silica powder obtained by mixing mineralizing element-doped natural silica powder and non-doped synthetic silica powder, or mineralizing element-doped synthetic silica powder and non-doped natural silica powder in a ratio of 1:1 to 1:100. When the ratio of the mineralizing element-doped silica powder (hereinafter referred to as "doped silica powder") is larger than 1:1, particles of the doped silica powder contact each other to form a too large island-like crystal, which results in the crystallization of the mineralizing element-maldistributed layer 3b in its entirety. Furthermore, when the ratio of the non-doped silica powder is larger than 1:100, the number of the island-like crystals becomes too small, and thus the improvement of the crucible strength can become insufficient. Therefore, the ratio is 1:1 to 1:100. The ratio of the doped silica powder and non-doped silica powder is preferred to be 1:3 to 1:20. The ratio is for example, 1:1, 1:3, 1:5, 1:10, 1:15, 1:20, 1:30, 1:50, or 1:100, and it can be in the range between two values of the values exemplified here. The doped silica powder can be formed by, for example, firing the mixture of silica powder and metal alkoxide under nitrogen atmosphere at 600 to 1100 degrees C.

A transparent layer having virtually no bubbles (i.e., bubble content of less than 0.5%) can be formed by subjecting the silica powder layer to a reduced pressure of −50 kPa or more and less than −95 kPa while fusing the silica powder layer. Furthermore, after the transparent layer is formed, a bubble-containing layer having a bubble content of 0.5% or more and less than 50% can be formed on the outer side of the transparent layer by subjecting the silica powder layer to a pressure of +10 kPa or more and less than −20 kPa. In the present specification, the bubble content rate refers to the ratio ($w_2/w_1$) of the volume ($w_2$) occupied by bubbles in a unit volume ($w_1$) of the crucible 1. In the present specification, the value of the pressure is the value with reference to the ambient air pressure.

3. Method of Manufacturing Silicon Ingot

A silicon ingot can be manufactured by the processes of (1) forming silicon melt by melting polycrystalline silicon in the vitreous silica crucible 1 of the present embodiment, and (2) dipping an end of a silicon seed crystal to the silicon melt, and pulling the seed crystal while rotating the seed crystal. The silicon single crystal has a shape having, from the upper side, a cylindrical silicon seed crystal, a cone-shaped silicon single crystal, a cylindrical silicon single crystal having the same diameter as the base of the upper cone (hereinafter, referred to as "straight body portion"), a cone-shaped silicon single crystal having a downward apex.

When multi-pulling is performed, polycrystalline silicon is recharged and melted in the vitreous silica crucible 1, and thereafter another silicon ingot is pulled.

The pulling of a silicon ingot is carried out usually at approximately 1450 to 1500 degrees C. When a crucible is exposed to such high temperature for a long time, the vitreous silica of the crucible is crystallized at a portion containing a mineralizing element. When the mineralizing element uniformly-distributed layer 3c is provided on the outer surface side, the mineralizing element uniformly-distributed layer 3c is first crystallized, and thereafter island-like crystallization occurs in the mineralizing element-maldistributed layer 3b. When the mineralizing element uniformly-distributed layer 3c is not provided, crystallization starts from the island-like crystallization in the mineralizing element-maldistributed layer 3b. Because vitreous silica, which is relatively easily deformed, exists between the island-like crystals, the island-like crystals enhance the crucible strength while preventing formation of cracks in the crucible.

EXAMPLE

According to the following procedures, there are evaluated the crystallinity of a silicon ingot, formation of cracks in the crucible, and the crucible strength.

A crucible having an outer diameter of 800 mm and a wall thickness of 15 mm was manufactured. The crucibles of Examples and Comparative Examples were manufactured so as to have vitreous silica layers shown in Table 1. The order of the respective vitreous silica layers from the left to the right in Table 1 denotes the order from the inner surface to the outer surface of the crucible. The mineralizing element uniformly-distributed layer was formed by use of doped silica powder obtained by adding Al as impurities to natural silica powder. The Al concentration was adjusted to achieve the mineralizing element concentration shown in Table 1.

Furthermore, the mineralizing element-maldistributed layer was formed by use of mixed silica powder obtained by mixing doped silica powder and non-doped silica powder in the ratio shown in Table 1. In Table 1, "D Natural" and "D Synthetic" denote mineralizing element-doped natural silica powder and synthetic silica powder, respectively. "ND Natural" and "ND Synthetic" denote non-doped natural silica powder and synthetic silica powder, respectively. The value of the ratio "Synthetic Natural" denotes the mixing ratio of the silica powders. For example, "D Synthetic: ND Natural=1:5" means that doped synthetic silica powder and non-doped natural silica powder were mixed in a ratio of 1:5. The average diameter of the non-doped silica powder was 400 μm. The size of the doped silica powder was adjusted so as to obtain the average diameter of the island regions shown in Table 1.

TABLE 1

| | Inner Surface Layer (3a) (mm) | Mineralizing Element-Maldistributed Layer (3b) | | | | Mineralizing Element Uniformly-Distributed Layer (3c) | | ND Natural Layer (mm) |
|---|---|---|---|---|---|---|---|---|
| | | Thickness (mm) | D Silica Powder: ND Silica Powder | Concentration (ppm) | Average Diameter (μm) | Thickness (mm) | Concentration (ppm) | |
| Ex. 1 | Synthetic Layer 1 mm | 14 | D Natural: ND Synthetic = 1:2 | 30 | 200 | 0 | — | 0 |
| Ex. 2 | Synthetic Layer 1 mm | 11 | D Natural: ND Synthetic = 1:2 | 30 | 200 | Natural Layer 3 mm | 50 | 0 |
| Ex. 3 | Synthetic Layer 1 mm | 11 | D Natural: ND Synthetic = 1:90 | 30 | 200 | Natural Layer 3 mm | 50 | 0 |
| Ex. 4 | Synthetic Layer 1 mm | 11 | D Natural: ND Synthetic = 1:2 | 450 | 200 | Natural Layer 3 mm | 500 | 0 |
| Ex. 5 | Synthetic Layer 1 mm | 11 | D Natural: ND Synthetic = 1:2 | 30 | 900 | Natural Layer 3 mm | 50 | 0 |
| Ex. 6 | Synthetic Layer 1 mm | 11 | D Natural: ND Synthetic = 1:200 | 30 | 200 | Natural Layer 3 mm | 50 | 0 |
| Ex. 7 | Synthetic Layer 1 mm | 11 | D Natural: ND Synthetic = 1:2 | 10 | 200 | Natural Layer 3 mm | 12 | 0 |
| Ex. 8 | Synthetic Layer 1 mm | 11 | D Natural: ND Synthetic = 1:2 | 30 | 1 | Natural Layer 3 mm | 50 | 0 |

TABLE 1-continued

| | Inner Surface Layer (3a) | Mineralizing Element-Maldistributed Layer (3b) | | | | Mineralizing Element Uniformly-Distributed Layer (3c) | | ND Natural Layer (mm) |
|---|---|---|---|---|---|---|---|---|
| | | Thickness (mm) | D Silica Powder: ND Silica Powder | Concentration (ppm) | Average Diameter (μm) | Thickness (mm) | Concentration (ppm) | |
| Ex. 9 | Natural Layer 1 mm | 11 | D Synthetic: ND Natural = 1:2 | 30 | 200 | Synthetic Layer 3 mm | 50 | 0 |
| Ex. 10 | Natural Layer 1 mm | 11 | D Synthetic: ND Natural = 1:90 | 30 | 200 | Synthetic Layer 3 mm | 50 | 0 |
| Ex. 11 | Natural Layer 1 mm | 11 | D Synthetic: ND Natural = 1:200 | 30 | 200 | Synthetic Layer 3 mm | 50 | 0 |
| Comp. Ex. 1 | Synthetic Layer 1 mm | 0 | — | — | — | — | — | 14 |
| Comp. Ex. 2 | Synthetic Layer 1 mm | 11 | D Natural: ND Synthetic = 1:0.5 | 30 | 200 | Natural Layer 3 mm | 50 | 0 |
| Comp. Ex. 3 | Synthetic Layer 1 mm | 11 | D Natural: ND Synthetic = 1:2 | 600 | 200 | Natural Layer 3 mm | 700 | 0 |
| Comp. Ex. 4 | Synthetic Layer 1 mm | 11 | D Natural: ND Synthetic = 1:2 | 30 | 1200 | Natural Layer 3 mm | 50 | 0 |
| Comp. Ex. 5 | Natural Layer 1 mm | 11 | D Synthetic: ND Natural = 1:0.5 | 30 | 200 | Synthetic Layer 3 mm | 50 | 0 |

Three silicon ingots each having a diameter of 300 mm were pulled by use of the crucibles of Examples and Comparative Examples. Each time one silicon ingot was pulled, polycrystalline silicon was recharged and melted. Crystallinity of the three silicon ingots was evaluated. Evaluation of the crystallinity was performed based on the single crystallization yield. The single crystallization yield was a value of (mass of the straight body section of the silicon single crystal)/(mass of silicon melt charged in the crucible right before pulling). The results are shown in Table 2. The evaluation criteria in Table 2 are as follows:

A: single crystallization yield is 0.80 or more and less than 0.99

B: single crystallization yield is 0.70 or more and less than 0.80

C: single crystallization yield is 0.60 or more and less than 0.70

D: single crystallization yield is less than 0.60

Figure 3:
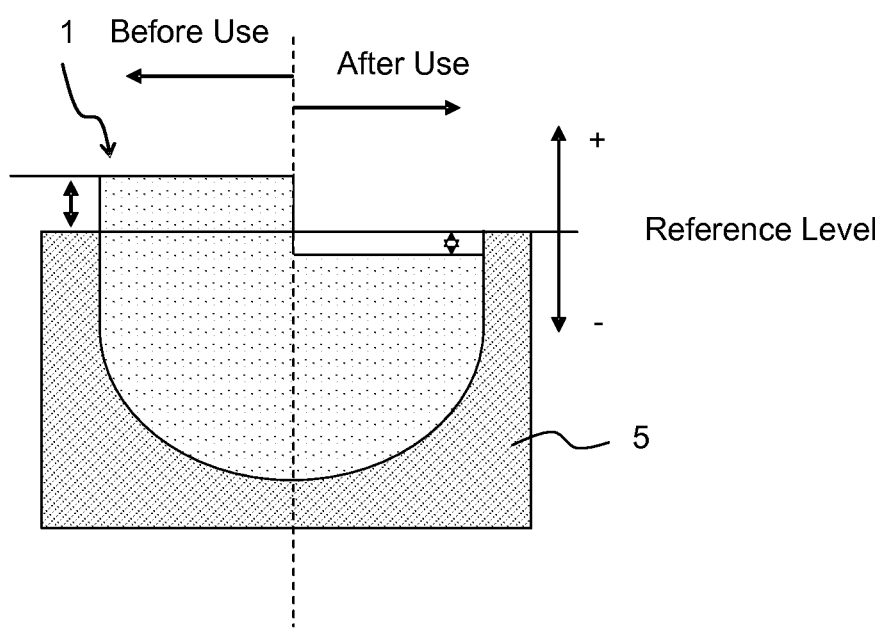
FIG. 3 is a sectional view for explaining the evaluation criteria of the crucible in Examples.

The crucible strength was evaluated based on the amount of sidewall lowering obtained by measuring, before and after use, the distance from the reference level (which is the upper end of the carbon susceptor 5) to the upper end of the crucible 1 (See FIG. 3). The results are shown in Table 2. The evaluation criteria are shown below.

Evaluation Criteria

A: the amount of sidewall lowering is less than 10 mm

B: the amount of sidewall lowering is 10 mm or more and less than 20 mm

C: the amount of sidewall lowering is 20 mm or more and less than 30 mm

D: the amount of sidewall lowering is 30 mm or more

TABLE 2

| | Crystallization of Mineralizing Element-Maldistributed Layer | Cracks? | Strength | Single Crystallization Yield | | |
|---|---|---|---|---|---|---|
| | | | | First Ingot | Second Ingot | Third Ingot |
| Ex. 1 | Island | Not Formed | C | A | B | B |
| Ex. 2 | Island | Not Formed | A | A | A | A |
| Ex. 3 | Island | Not Formed | B | A | A | B |
| Ex. 4 | Island | Not Formed | A | A | A | A |
| Ex. 5 | Island | Not Formed | A | A | A | A |
| Ex. 6 | Island | Not Formed | D | B | C | D |
| Ex. 7 | Island | Not Formed | D | B | C | D |
| Ex. 8 | Island | Not Formed | D | B | C | D |
| Ex. 9 | Island | Not Formed | A | B | B | B |
| Ex. 10 | Island | Not Formed | A | B | B | B |
| Ex. 11 | Island | Not Formed | A | B | B | B |
| Comp. Ex. 1 | — | Not Formed | D | B | D | Not Obtained |
| Comp. Ex. 2 | Entire | Formed | A | A | Not Obtained | — |
| Comp. Ex. 3 | Entire | Formed | A | A | Not Obtained | — |
| Comp. Ex. 4 | Entire | Formed | A | A | Not Obtained | — |
| Comp. Ex. 5 | Entire | Formed | B | B | Not Obtained | — |

After pulling of three silicon ingots, the crucible was inspected to find that the island-like crystals were formed in the mineralizing element-maldistributed layer of the crucible of Examples.

When the crucible of Example 1 was used, the single crystallization yield of the first ingot was high, and the single crystallization yield of the second and third ingots slightly deteriorated. No cracks were observed, and a sidewall lowering of 25 mm was observed.

When the crucible of Examples 2, 4, or 5 was used, the single crystallization yield of the first, second, and third ingots were high. No cracks were observed, and a sidewall lowering of less than 10 mm was observed.

When the crucible of Example 3 was used, the single crystallization yield of the first and second ingots were high, and the single crystallization yield of the third ingot slightly deteriorated. No cracks were observed, and a sidewall lowering of 15 mm was observed.

Example 6 is different from Example 2 in that the ratio of the doped silica powder was decreased. In this Example, the ratio of the doped silica powder was too low, and thus even though island-like crystals were formed in the mineralizing element-maldistributed layer, the number was not enough to sufficiently enhance the crucible strength.

Example 7 is different from Example 2 in that the mineralizing element concentration was lowered. Crystallization of the crucible of Example 6 was insufficient, and thus the crucible strength was not sufficiently enhanced.

Example 8 is different from Example 2 in that the size of the island regions was decreased. In the crucible of Example 8, although the island-like crystals were formed, the size was small, and thus the crucible strength was not sufficiently enhanced.

Examples 9 to 11 are different from Examples 2, 3, and 6, respectively, in that natural silica powder was replaced with synthetic silica powder, and synthetic silica powder was replaced with natural silica powder. In the crucible of Examples 9 to 11, island-like crystals were formed in the mineralizing element-maldistributed layer, and formation of cracks was suppressed.

When the crucible of Comparative Example 1 was used, the single crystallization yield of the first ingot slightly deteriorated, and single crystal was hardly obtained in the second ingot. During pulling of the third silicon ingot, the non-doped natural layer was not crystallized, and thus sidewall lowering was large, and then the pulling of a single crystal was stopped. No cracks were observed.

In Comparative Example 2, the ratio of doped silica powder was too high, and thus the mineralizing element was not maldistributed in island-like form in the mineralizing element-maldistributed layer, and thus the layer was crystallized in its entirety, and thus cracks were formed.

In Comparative Example 3, the mineralizing element concentration in the doped silica powder was too high, and thus the mineralizing element was not maldistributed in island-like form in the mineralizing element-maldistributed layer, and the layer was crystallized in its entirety, and thus cracks were formed.

In Comparative Example 4, the size of the doped silica powder was too large, and thus the mineralizing element was not maldistributed in island-like form in the mineralizing element-maldistributed layer, and the layer was crystallized in its entirety, and thus cracks were formed.

Comparative Example 5 is different from Comparative Example 2 in that natural silica powder was replaced with synthetic silica powder, and synthetic silica powder was replaced with natural silica powder. In the crucible of Comparative Example 5 as well as Comparative Example 2, the mineralizing element-maldistributed layer was crystallized in its entirety.

What is claimed is:

1. A vitreous silica crucible for pulling a silicon single crystal having a wall, the wall comprising, from an inner surface side toward an outer surface side of the crucible, a non-doped inner surface layer made of natural vitreous silica or synthetic vitreous silica, a mineralizing element-maldistributed vitreous silica layer containing dispersed island regions, each containing a mineralizing element, and wherein the vitreous silica of the island regions and the vitreous silica of a surrounding region of the island regions is a combination of mineralizing element-doped natural vitreous silica and non-doped synthetic vitreous silica, or a combination of mineralizing element-doped synthetic vitreous silica and non-doped natural vitreous silica, and the inner surface layer is made of vitreous silica of a different kind from that of the island regions.

2. The vitreous silica crucible of claim 1, wherein the average diameter of the island regions is 50 μm to 1 mm.

3. The vitreous silica crucible of claim 1, wherein the concentration maximum value of a mineralizing element in the island regions is 20 to 600 ppm.

4. The vitreous silica crucible of claim 1, wherein the mineralizing element in the mineralizing element-maldistributed vitreous silica layer is Al.

5. The vitreous silica crucible of claim 1, wherein the inner surface layer is synthetic vitreous silica, and the vitreous silica of the island regions and the vitreous silica of the surrounding region is the combination of mineralizing element-doped natural vitreous silica and non-doped synthetic vitreous silica.

6. The vitreous silica crucible of claim 1, wherein the inner surface layer is natural vitreous silica, and the vitreous silica of the island regions and the vitreous silica of the surrounding region is the combination of mineralizing element-doped synthetic vitreous silica and non-doped natural vitreous silica.

7. The vitreous silica crucible of claim 5, further comprising a mineralizing element uniformly-distributed vitreous silica layer on an outer side of the mineralizing element-maldistributed vitreous silica layer, the mineralizing element uniformly-distributed vitreous silica layer containing a substantially uniformly dispersed mineralizing element, wherein the mineralizing element uniformly-distributed vitreous silica layer is made of vitreous silica of a different kind from the vitreous silica of the surrounding region.

8. The vitreous silica crucible of claim 7, wherein the concentration of the mineralizing element in the mineralizing element uniformly-distributed vitreous silica layer is 20 to 600 ppm.

9. The vitreous silica crucible of claim 7, wherein the concentration of the mineralizing element in the mineralizing element uniformly-distributed vitreous silica layer is larger than the concentration maximum value of the mineralizing element in the island regions.

10. The vitreous silica crucible of claim 7, wherein the mineralizing element in the mineralizing element uniformly-distributed vitreous silica layer is Al.

11. The vitreous silica crucible of claim 1, wherein the mineralizing element-maldistributed vitreous silica layer is formed by fusing mixed silica powder obtained by mixing mineralizing element-doped natural silica powder and non-doped synthetic silica powder, or mineralizing element-doped synthetic silica powder and non-doped natural silica powder in a ratio of 1:1 to 1:100.

* * * * *